(12) United States Patent
Takekida

(10) Patent No.: US 8,760,935 B2
(45) Date of Patent: Jun. 24, 2014

(54) NONVOLATILE SEMICONDUCTOR MEMORY DEVICE

(75) Inventor: Hideto Takekida, Aichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 13/407,991

(22) Filed: Feb. 29, 2012

(65) Prior Publication Data

US 2012/0224427 A1 Sep. 6, 2012

(30) Foreign Application Priority Data

Mar. 1, 2011 (JP) ................................. 2011-043795

(51) Int. Cl.
*G11C 16/04* (2006.01)

(52) U.S. Cl.
USPC ............ 365/185.29; 365/185.18; 365/185.22; 365/185.3

(58) Field of Classification Search
USPC ................ 365/185.29, 185.18, 185.22, 185.3
See application file for complete search history.

(56) References Cited

U.S. PATENT DOCUMENTS

| | | | | |
|---|---|---|---|---|
| 5,963,477 A | * | 10/1999 | Hung | 365/185.22 |
| 5,982,670 A | * | 11/1999 | Yamashita | 365/185.29 |
| 6,496,417 B1 | * | 12/2002 | Shiau et al. | 365/185.2 |
| 6,771,540 B2 | * | 8/2004 | Satoh et al. | 365/185.18 |
| 7,272,050 B2 | * | 9/2007 | Han et al. | 365/185.22 |
| 7,633,813 B2 | * | 12/2009 | Wang et al. | 365/185.29 |
| 2009/0052242 A1 | | 2/2009 | Takekida et al. | |
| 2012/0020165 A1 | | 1/2012 | Takekida | |

FOREIGN PATENT DOCUMENTS

| | | |
|---|---|---|
| JP | 11-273368 | 10/1999 |
| JP | 2000-222895 | 8/2000 |
| JP | 2001-85646 | 3/2001 |
| JP | 2001-126489 | 5/2001 |
| JP | 2004-185688 | 7/2004 |
| JP | 2005-175070 | 6/2005 |
| JP | 2006-190440 | 7/2006 |
| JP | 2007-305283 | 11/2007 |
| JP | 2008-541330 | 11/2008 |
| JP | 2009-301607 | 12/2009 |
| JP | 2010-20814 | 1/2010 |
| JP | 2010-507180 | 3/2010 |
| JP | 2010-520571 | 6/2010 |
| WO | WO 2006/122245 A1 | 11/2006 |
| WO | WO 2008/048798 A1 | 4/2008 |

OTHER PUBLICATIONS

Office Action issued Jun. 18, 2013 in Japanese Patent Application No. 2011-043795 (with English translation).
Office Action mailed Mar. 4, 2014 in Japanese Patent Application No. 2011-043795 filed Mar. 1, 2011 (with English Translation).

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A block dividing unit groups one-word lines into p groups, to divide a block into p divisional blocks. An erasing unit has an erasing operation performed on data stored in memory cells in a memory cell array, on a divisional block basis. An erasing verifying unit has an erasing verifying operation performed on memory cells subjected to the erasing operation, on a divisional block basis.

20 Claims, 11 Drawing Sheets

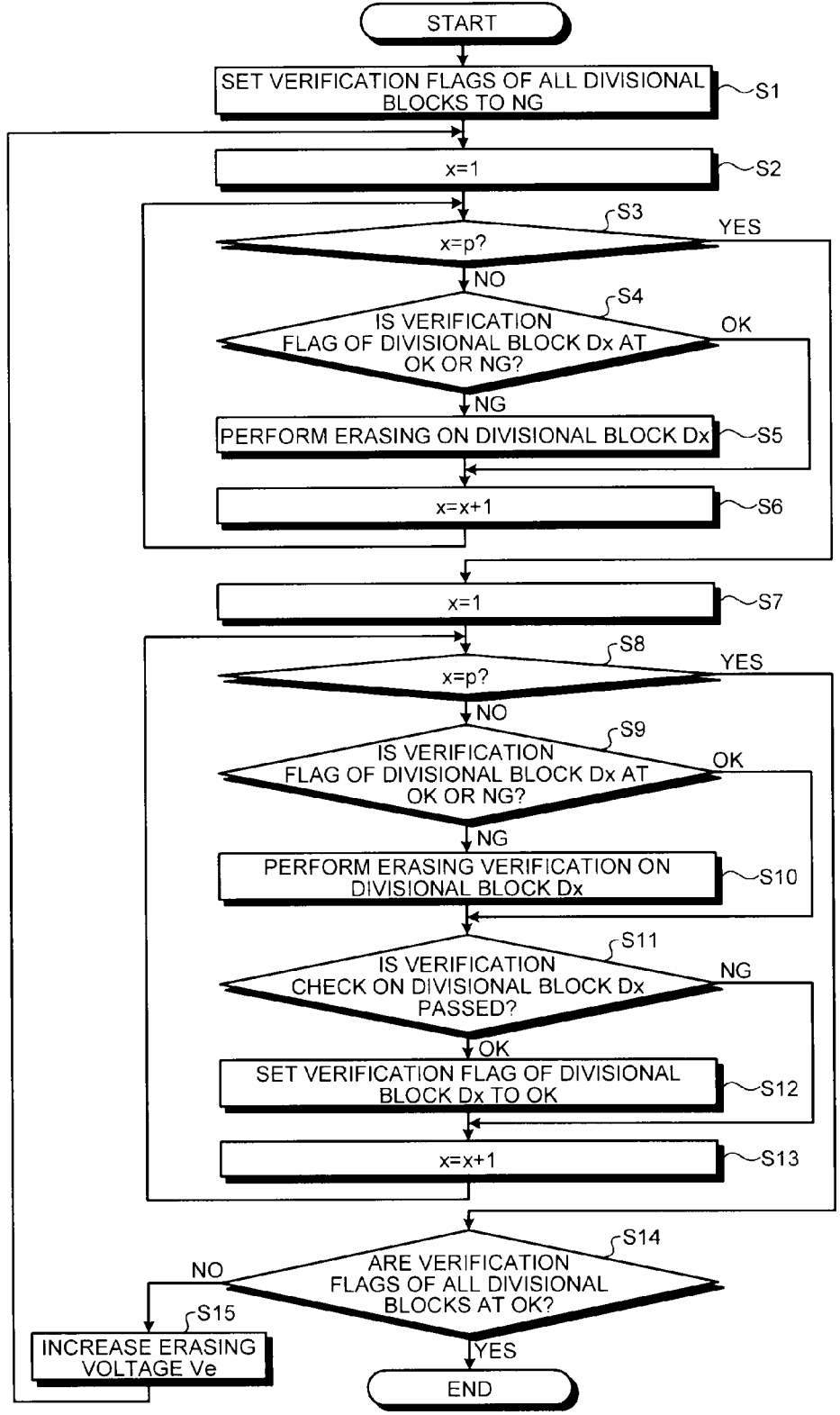

NONVOLATILE SEMICONDUCTOR MEMORY DEVICE

CROSS-REFERENCE TO RELATED APPLICATIONS

This application is based upon and claims the benefit of priority from Japanese Patent Application No. 2011-043795, filed on Mar. 1, 2011; the entire contents of which are incorporated herein by reference.

FIELD

Embodiments described herein relate generally to nonvolatile semiconductor memory devices.

BACKGROUND

In NAND flash memory, all the word lines are set to 0 V, and the well voltage is increased, so that collective erasing is performed on all the memory cells in a subject block. Meanwhile, memory cells vary in characteristics. Some memory cells always exist in lower regions in the threshold value distribution and have poor reactions, some memory cells have high neutral threshold values, and some memory cells have high threshold values prior to erasing. Therefore, erasing in all the memory cells might not be completed by a single erasing operation, and excessive stress might be applied to memory cells in which erasing has been completed in early stages.

BRIEF DESCRIPTION OF THE DRAWINGS

FIG. 6 is a flowchart illustrating erasing operations and erasing verifying operations in the nonvolatile semiconductor memory device of FIG. 1;

DETAILED DESCRIPTION

A nonvolatile semiconductor memory device of an embodiment includes a memory cell array, a block dividing unit, an erasing unit, and an erasing verifying unit. The memory cell array has a block that includes m (m being an integer equal to or greater than 2) cell units sharing l (l being an integer equal to or greater than 2) word lines. The block dividing unit divides the block into p (p being an integer equal to or greater than 2) by grouping the l word lines into p groups. The erasing unit has an erasing operation performed on each of divisional blocks formed by the dividing performed by the block dividing unit, while applying a higher voltage than the voltage of the word line of a selected row to the word line of an unselected row. The erasing verifying unit has an erasing verifying operation performed on each of the divisional blocks in the block subjected to the erasing operation by the erasing unit.

The following is a description of nonvolatile semiconductor memory devices according to embodiments, with reference to the accompanying drawings. It should be noted that the present invention is not limited to these embodiments.

First Embodiment

Figure 1:
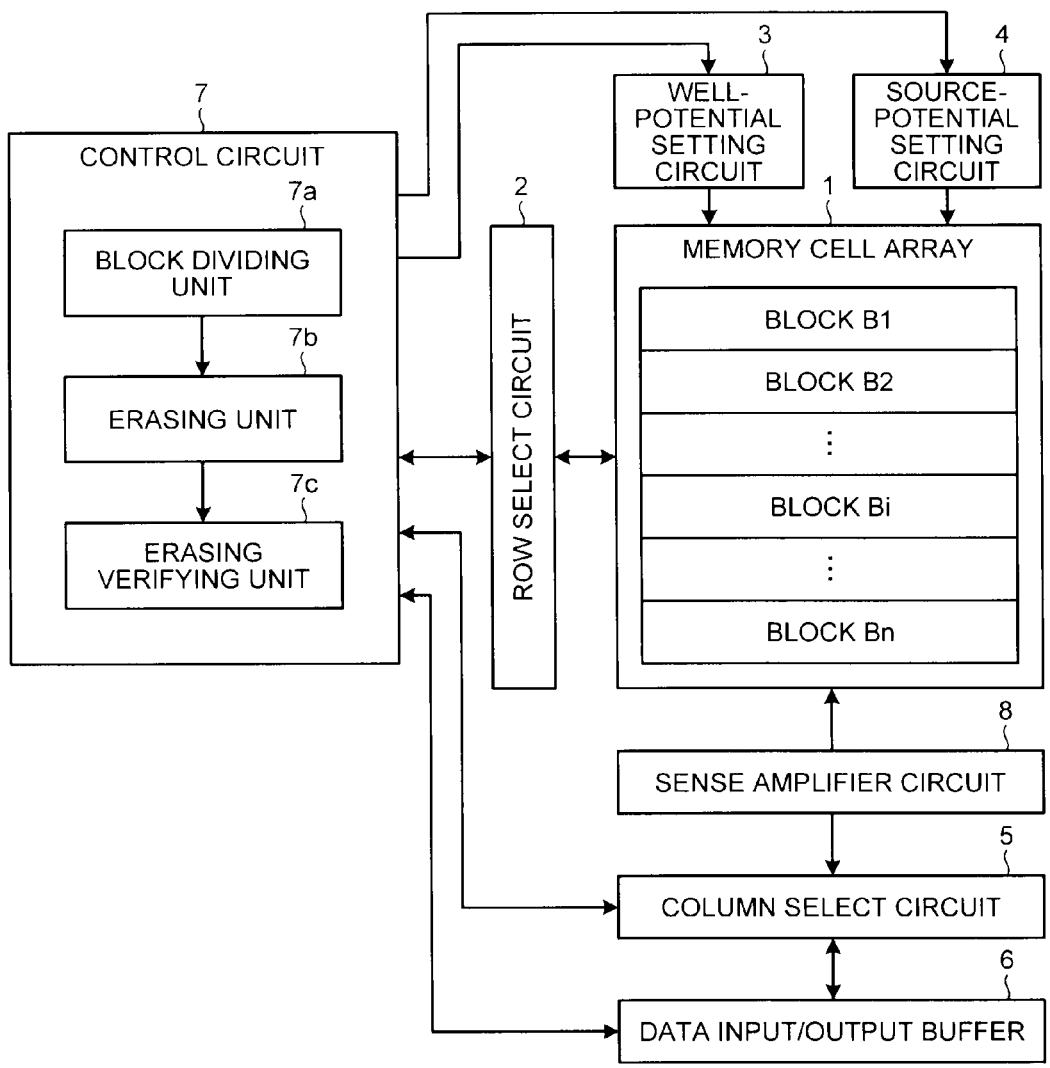
FIG. 1 is a block diagram schematically illustrating the structure of a nonvolatile semiconductor memory device according to a first embodiment.

FIG. 1 is a block diagram schematically illustrating the structure of a nonvolatile semiconductor memory device according to a first embodiment. In the following description, NAND flash memory will be described as an example of the nonvolatile semiconductor memory device.

In FIG. 1, this nonvolatile semiconductor memory device includes a memory cell array 1, a row selection circuit 2, a well-potential setting circuit 3, a source-potential setting circuit 4, a column selection circuit 5, a data input/output buffer 6, a control circuit 7, and a sense amplifier circuit 8.

In the memory cell array 1, memory cells storing data are arranged in a matrix in the row direction and the column direction. Each one memory cell may store data of one bit, or may be multivalued to store data of two or more bits.

Here, the memory cell array 1 is divided into n (n being a positive integer) blocks B1 through Bn. It should be noted that each of the blocks B1 through Bn can have NAND cell units arranged in the row direction.

Figure 2:
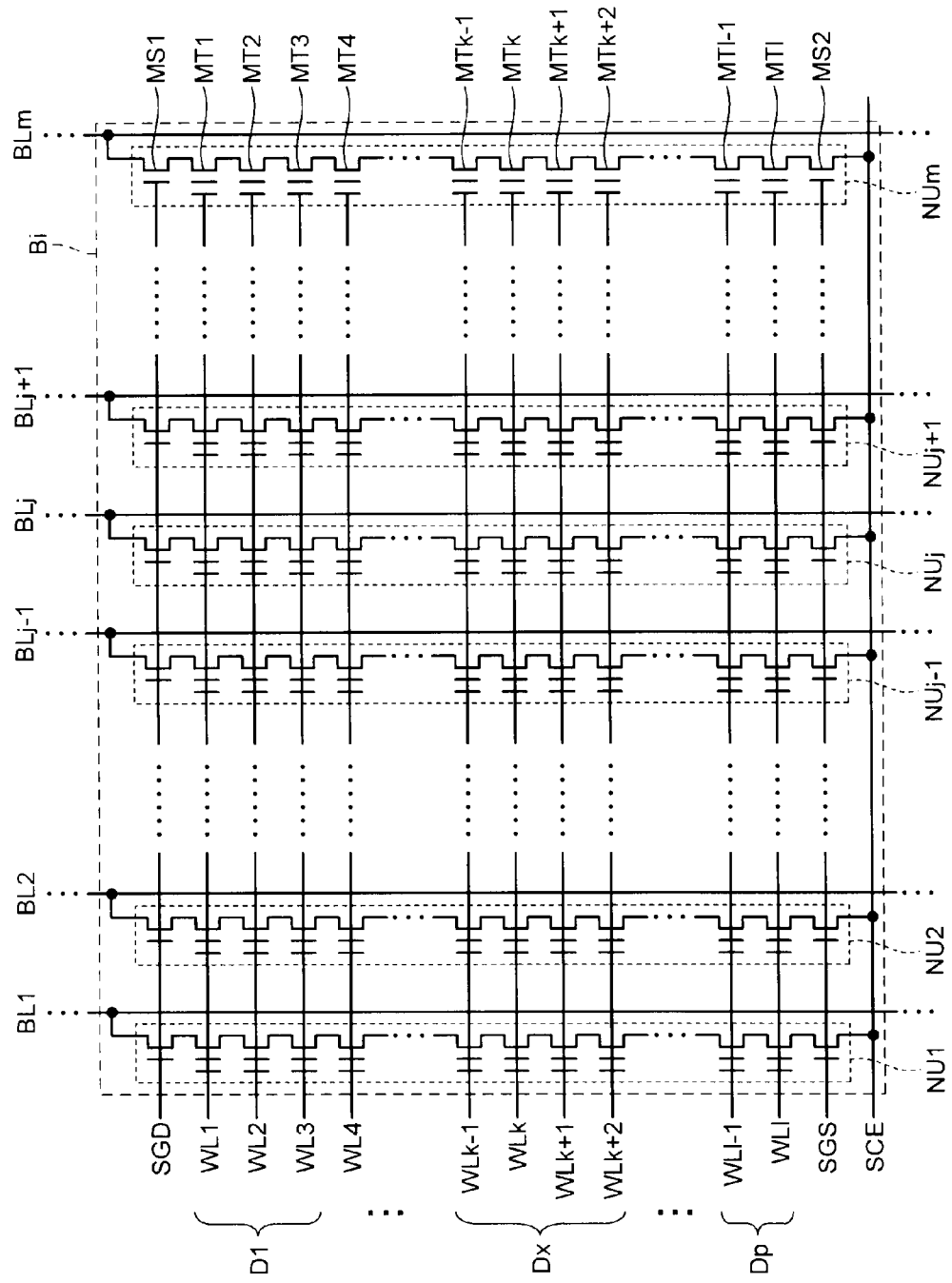
FIG. 2 is a circuit diagram schematically illustrating the structures of the blocks in the nonvolatile semiconductor memory device of FIG. 1.

FIG. 2 is a circuit diagram schematically illustrating the structures of the blocks in the nonvolatile semiconductor memory device of FIG. 1.

In FIG. 2, l (l being a positive integer) word lines WL1 through WLl, select gate lines SGD and SGS, and a source line SCE are provided in each block Bi (i being an integer satisfying $1 \le i \le n$). Also, m (m being a positive integer) bit lines BL1 through BLm are shared among the blocks B1 through Bn.

In each block Bi, m NAND cell units NU1 through NUm are provided, and the NAND cell units NU1 through NUm are located adjacent to the respective bit lines BL1 through BLm and are arranged in the row direction.

In the NAND cell units NU1 through NUm, l cell transistors MT1 through MTl and select transistors MS1 and MS2 are provided. It should be noted that one cell transistor MTk (k being an integer satisfying $1 \le k \le l$) can be provided in each one memory cell in the memory cell array 1. The l cell transistors MT1 through MTl connected in series are provided in each NAND string. The select transistors MS1 and MS2 connected to both ends of each NAND string are provided in the NAND cell unit NUj (j being an integer satisfying 1≤j≤m).

In the NAND cell units NU1 through NUm, the word lines WL1 through WLl are connected to the control gate electrodes of the cell transistors MT1 through MTl, respectively. In each NAND cell unit NUj, one end of the NAND string having the cell transistors MT1 through MTl provided therein is connected to the bit line BLj via the select transistor MS1, and the other end of the NAND string is connected to the source line SCE via the select transistor MS2.

In FIG. 1, the row select circuit 2 can select a memory cell in the row direction of the memory cell array 1 at the time of memory cell reading, writing, or erasing. The well-potential setting circuit 3 can set the well-potential of the memory cell array 1 at the time of memory cell reading, writing, or erasing. The source-potential setting circuit 4 can set the source-potential of the memory cell array 1 at the time of memory cell reading, writing, or erasing. The column select circuit 5 can select a memory cell in the column direction of the memory cell array 1 at the time of memory cell reading, writing, or erasing. The sense amplifier circuit 8 can determine the data read from the memory cells for each column. The data input/output buffer 6 can send commands and addresses received from the outside to the control circuit 7, and perform data exchanges between the sense amplifier circuit 8 and the outside.

Based on the commands and addresses, the control circuit 7 can control operations of the row select circuit 2, the well-potential setting circuit 3, the source-potential setting circuit 4, and the column select circuit 5. Here, the control circuit 7 includes a block dividing unit 7a, an erasing unit 7b, and an erasing verifying unit 7c.

The block dividing unit 7a can divide each block Bi into p (p being an integer equal to or greater than 2) parts by grouping the l word lines WL1 through WLl into p groups. That is, by dividing each block Bi into p parts, the block dividing unit 7a can form p divisional blocks D1 through Dp, as illustrated in FIG. 2. The erasing unit 7b can have erasing operations performed on the data stored in the memory cells in the memory cell array 1 for each of the divisional blocks D1 through Dp. At this point, the erasing unit 7b can apply a higher voltage than the voltage applied to the word lines WL1 through WLl of the selected row, to the word lines WL1 through WLl of the unselected rows. The erasing verifying unit 7c can have an erasing verifying operation performed on the memory cell on which an erasing operation has been performed, for each of the divisional blocks D1 through Dp.

When an erasing operation is performed on a block Bi, a selected word line voltage VWe is applied to the word lines WLk−1 through WLk+2 of a divisional block Dx. An unselected word line voltage VWLne is applied to the word lines WL1 through WLk−2 and WLk+3 through WLl of the other divisional blocks D1 through Dx−1 and Dx+1 through Dp. The selected word line voltage VWe can be set to 0 V, for example. Here, the memory cells connected to the word lines WLk−1 through WLk+2 belong to the divisional block Dx (x being an integer satisfying 2≤x≤p).

The well-potential of the memory cell array 1 is set as an erasing voltage Ve. For example, the erasing voltage Ve can be set to approximately 16 to 20 V. The erasing voltage Ve can be applied to the source line SCE and the select gate lines SGD and SGS of the block Bi.

Figure 3:
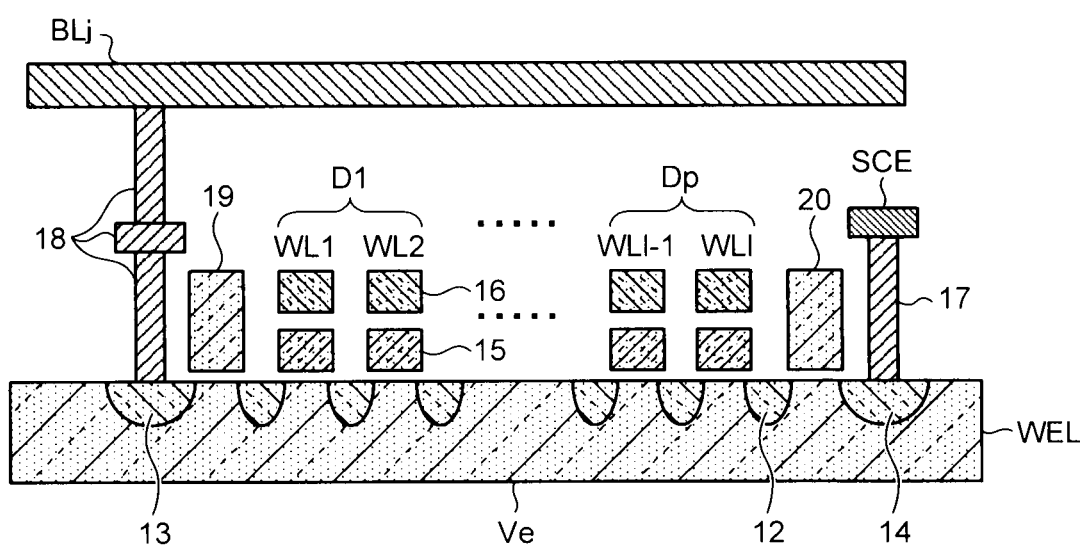
FIG. 3 is a cross-sectional view of a cell unit, illustrating erasing operations in the nonvolatile semiconductor memory device of FIG. 1.

FIG. 3 is a cross-sectional view of a cell unit, illustrating erasing operations in the nonvolatile semiconductor memory device of FIG. 1.

In FIG. 3, floating gate electrodes (charge storage layer) 15 and select gate electrodes 19 and 20 are arranged on a well WEL, and control gate electrodes 16 are arranged on the floating gate electrodes 15. It should be noted that the well WEL is insulated from the floating gate electrodes 15 by a tunnel insulating film (not illustrated). The floating gate electrodes 15 are insulated from the control gate electrodes 16 by an interelectrode insulating film (not illustrated). The well WEL can be formed in a semiconductor substrate. Here, one floating gate electrode 15 and the control gate electrode 16 placed thereon can form one memory cell.

In the well WEL, impurity diffused layers (source/drain) 12, 13, and 14 are formed. The impurity diffused layers 12, 13, and 14 are located between the floating gate electrodes 15, between the select gate electrodes 19 and 20, and between the floating gate electrodes 15 and the select gate electrodes 19 and 20. For example, the well WEL may be of the P-type, and the impurity diffused layers 12, 13, and 14 may be of the N-type.

The impurity diffused layer 13 is connected to the bit line BLj via a connected conductor 18, and the impurity diffusion layer 14 is connected to the source line SCE via a connected conductor 17. The control gate electrodes 16 of the respective memory cells are connected to the word lines WL1 through WLl, and the select gate electrodes 19 and 20 are connected to the select gate lines SGD and SGS, respectively.

The selected word line voltage VWe is applied to the word lines WLk−1 through WLk+2 of a divisional block Dx. The unselected word line voltage VWLne is applied to the word lines WL1 through WLk−2 and WLk+3 through WLl of the other divisional blocks D1 through Dx−1 and Dx+1 through Dp. Where the well-potential of the memory cell array 1 is set as the erasing voltage Ve, a high voltage is applied between the well WEL and the control gate electrodes 16 of the memory cells in the divisional block Dx. As a result, the electrons stored in the floating gate electrodes 15 of the memory cells in the divisional block Dx are discharged toward the well WEL, and an erasing operation is performed on a memory cell in the divisional block Dx.

Such an erasing operation is repeated on all the divisional blocks D1 through Dp in a block Bi, one divisional block at a time among the divisional blocks D1 through Dp.

It should be noted that the unselected word line voltage VWLne preferably satisfies Ve/2≤VWLne≤Ve. Here, the unselected word line voltage VWLne is made equal to or lower than the erasing voltage Ve, so that dielectric breakdown due to the potential difference between the selected word line and the unselected word lines can be prevented. By setting the unselected word line voltage VWLne at Ve/2 or higher, the voltage of the floating gate electrodes 15 of the unselected cells can be restrained from being drawn to the voltage of the floating gate electrode 15 of the selected cell due to capacitance coupling with adjacent cells. Accordingly, inadvertent erasing of an unselected cell can be prevented.

After erasing operations have been performed on memory cells of all the divisional blocks D1 through Dp in the block Bi, erasing verifying operations are performed to determine whether complete erasing has been performed. At this point, a determination voltage VWLev is applied to the word lines WLk−1 through WLk+2 of the divisional block Dx, and a readout voltage VWLer is applied to the word lines WL1 through WLk−2 and WLk+3 through WLl of the other divisional blocks D1 through Dx−1 and Dx+1 through Dp. A readout voltage Vsg is applied to the select gate lines SGD and SGS, 0 V is applied to the source line SCE, and the well-potential of the memory cell array 1 is set to 0 V. A precharge voltage Vp is applied to the bit line BLj. For example, the determination voltage VWLev can be set to 0 V.

The readout voltage Vsg is a voltage sufficiently high to turn on the select transistors MS1 and MS2. The readout voltage VWLer is a voltage sufficiently high to turn on the cell transistors MT1 through MTk−2 and MTk+3 through MTl of the divisional blocks D1 through Dx−1 and Dx+1 through Dp other than the divisional block Dx. The determination voltage VWLev is a voltage for determining whether the divisional block Dx is in an erased state.

Figure 4:
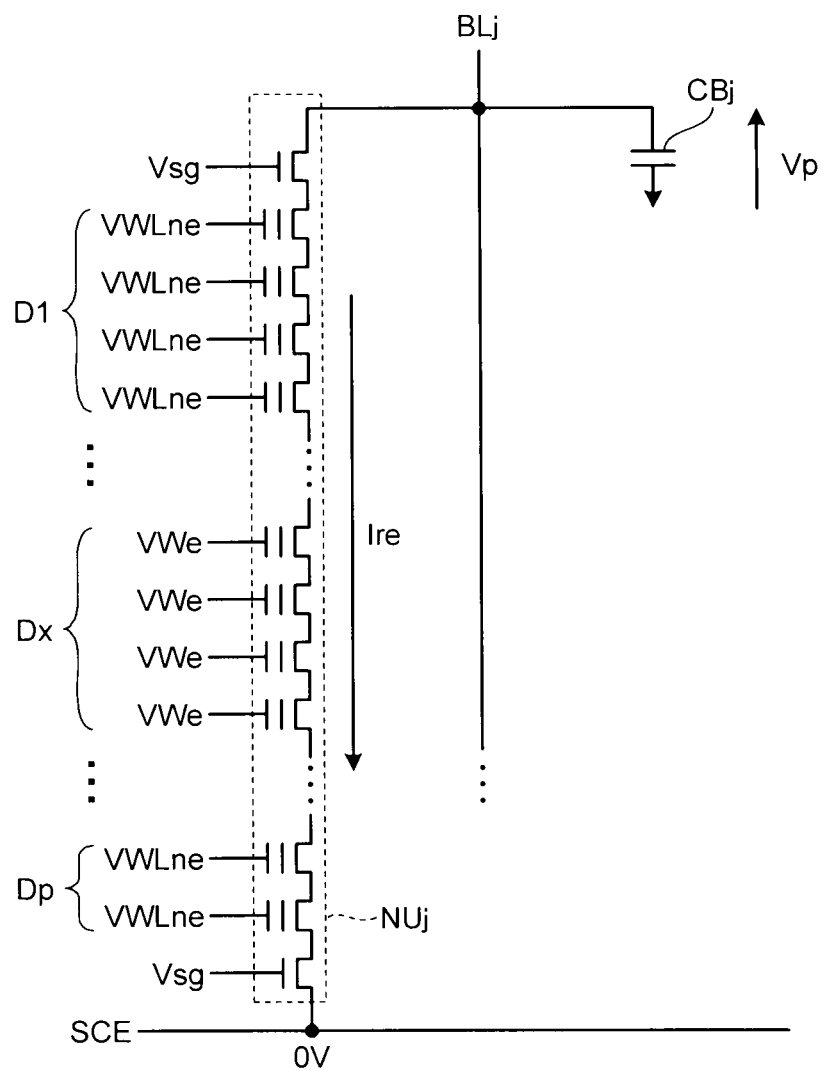
FIG. 4 is a circuit diagram of a cell unit, illustrating erasing verifying operations in the nonvolatile semiconductor memory device of FIG. 1.

FIG. 4 is a circuit diagram of a cell unit, illustrating erasing verifying operations in the nonvolatile semiconductor memory device of FIG. 1.

In FIG. 4, a parasitic capacitance CBj is attached to the bit line BLj. After erasing operations are performed on the cell transistors MTk−1 through MTk+2 in the divisional block Dx, the threshold voltage of the cell transistors MTk−1 through MTk+2 become equal to or lower than the determination voltage VWLev. When an erasing verifying operation is performed, a discharge current Ire flows via the NAND cell unit NUj, and the parasitic capacitance CBj is made to discharge. At this point, the potential of the bit line BLj depends on the threshold voltage of the cell transistor having the shallowest erasing performed thereon among the cell transistors MTk−1 through MTk+2. The potential of the bit line BLj at this point is compared with an erasing verifying voltage. If the potential of the bit line BLj is equal to or higher than the erasing verifying voltage, it is determined that complete erasing has been performed on the cell transistors MTk−1 through MTk+2 in the divisional block Dx. If the potential of the bit line BLj is lower than the erasing verifying voltage, the erasing performed on the cell transistors MTk−1 through MTk+2 in the divisional block Dx is determined to be incomplete.

Such an erasing verifying operation is repeated on all the divisional blocks D1 through Dp in the block Bi, one divisional block at a time among the divisional blocks D1 through Dp. If it is determined that there is a divisional block having incomplete erasing performed thereon among the divisional blocks D1 through Dp, an erasing operation and an erasing verifying operation are repeated on the divisional block among the divisional blocks D1 through Dp.

Figure 5:
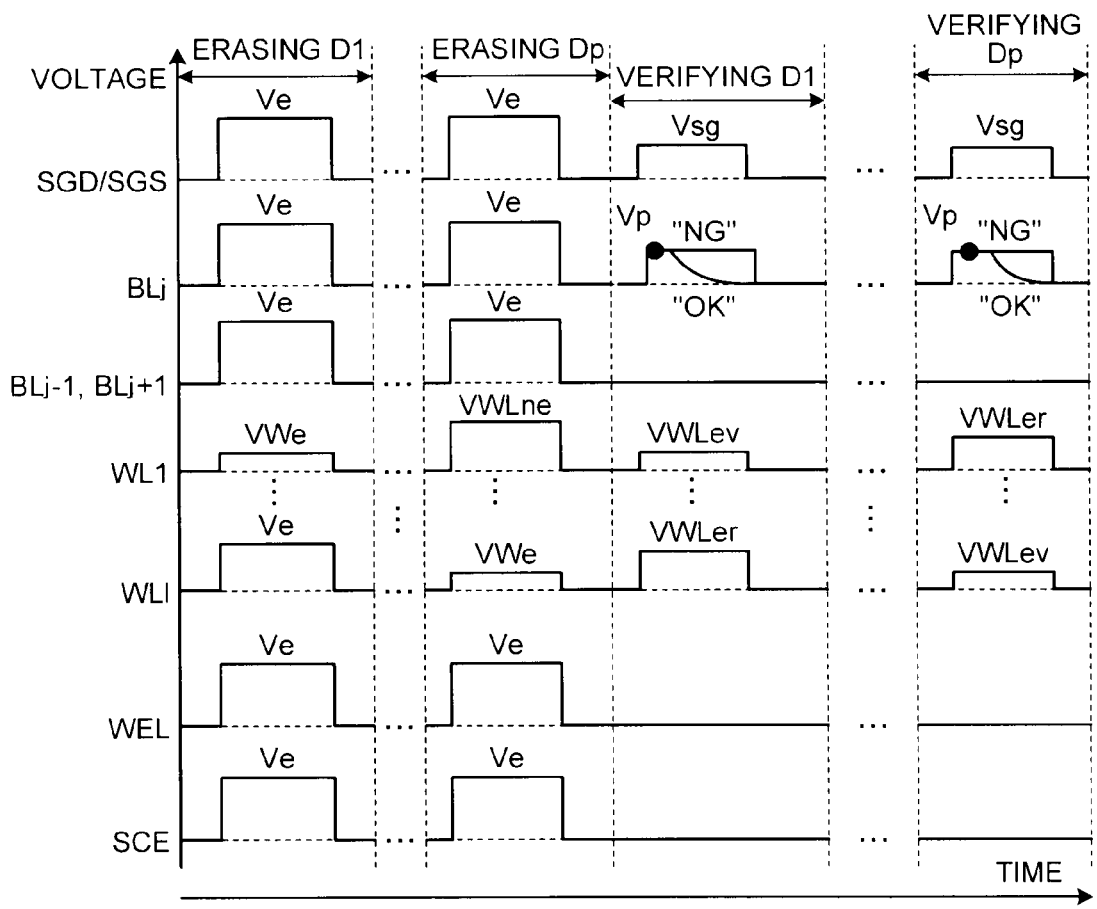
FIG. 5 is a timing chart illustrating the first erasing operations and erasing verifying operations performed on the p divisional blocks in the nonvolatile semiconductor memory device of FIG. 1.

FIG. 5 is a timing chart illustrating the first erasing operations and erasing verifying operations performed on the p divisional blocks in the nonvolatile semiconductor memory device of FIG. 1.

In FIG. 5, after erasing operations are performed sequentially on the divisional blocks D1 through Dp, erasing verifying operations are performed sequentially on the divisional blocks D1 through Dp. At this point, the unselected word line voltage VWLne to be applied to those of the word lines WL1 through WLl of the divisional blocks D1 through Dp not to be subjected to erasing operations is made higher than the selected word line voltage VWe to be applied to those of the word lines WL1 through WLl of the divisional blocks D1 through Dp to be subjected to erasing operations.

Also, the readout voltage VWLer to be applied to those of the word lines WL1 through WLl of the divisional blocks D1 through Dp not to be subjected to erasing verifying operations is made higher than the determination voltage VWLev to be applied to those of the word lines WL1 through WLl of the divisional blocks D1 through Dp to be subjected to erasing verifying operations.

The precharge voltage Vp is then applied to the bit line BLj, and a check is made to determine whether the charges in the bit line BLj are discharged via the NAND cell unit NUj. In this manner, a check is made to determine whether each of the divisional blocks D1 through Dp is in an erased state.

FIG. 6 is a flowchart illustrating erasing operations and erasing verifying operations in the nonvolatile semiconductor memory device of FIG. 1.

In FIG. 6, verification flags of all the divisional blocks D1 through Dp are set to NG (S1), and x is set to 1 (S2).

If x is not p (S3), a check is made to determine whether the verification flag of a divisional block Dx is at OK or NG (S4). If the verification flag of the divisional block Dx is at NG, an erasing operation is performed on the divisional block Dx (S5), and x is incremented by 1 (S6). The above procedures of S3 through S6 are repeated for all the divisional blocks D1 through Dp (S3).

Next, x is set to 1 (S7). If x is not p (S8), a check is made to determine whether the verification flag of a divisional block Dx is at OK or NG (S9). If the verification flag of the divisional block Dx is at NG, an erasing verifying operation is performed on the divisional block Dx (S10). If the result of a verification check on the divisional block Dx indicates OK (S11), the verification flag of the divisional block Dx is set to OK (S12), and x is incremented by 1 (S13). The above procedures of S8 through S13 are repeated for all the divisional blocks D1 through Dp (D8).

Next, a check is made to determine whether the verification flags of all the divisional blocks D1 through Dp are at OK (S14). If not all the verification flags of the divisional blocks D1 through Dp are at OK, the erasing voltage Ve is stepped up (S15), and the operation returns to the procedure of S2. The procedures of S2 through S15 are repeated until the verification flags of all the divisional blocks D1 through Dp are at OK (S14).

In this manner, erasing operations can be performed on each of the divisional blocks D1 through Dp, and it is possible to prevent application of a high erasing voltage Ve to those of the divisional blocks D1 through Dp on which erasing is performed while the erasing voltage Ve is low. Accordingly, excessive stress applied to memory cells on which erasing has been performed in early stages can be reduced.

Also, erasing verifying operations are performed on the respective divisional blocks D1 through Dp. Accordingly, a sufficient control voltage can be applied to those of the divisional blocks D1 through Dp not to be subjected to erasing verifying operations, so as to turn on the cell transistors MT1 through MTl of those divisional blocks. Accordingly, the channel resistances of the NAND cell units NU1 through NUm at the time of verification reading can be made lower, and apparent increases in the threshold values of the cell transistors MT1 through MTl can be restrained. In view of this, erasing of memory cells can be prevented from becoming deep (the threshold values of the cell transistors MT1 through MTl can be not to become too low).

FIGS. 7A through 7D are cross-sectional views of a cell unit, illustrating block dividing methods in the nonvolatile semiconductor memory device of FIG. 1.

Figure 7A:
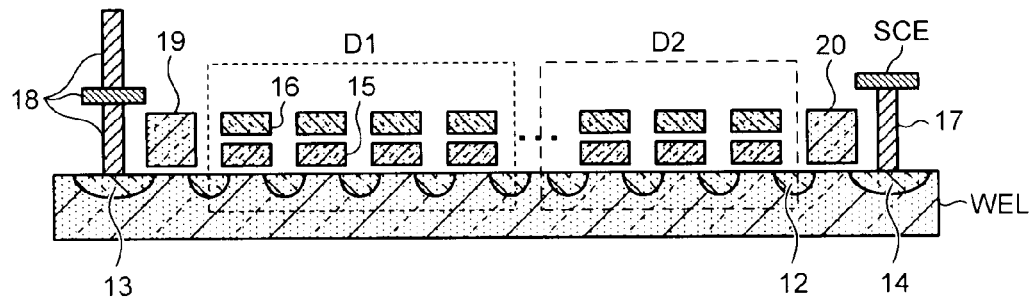
FIGS. 7A through 7D are cross-sectional views of a cell unit, illustrating block dividing methods in the nonvolatile semiconductor memory device of FIG. 1.
Figure 7B:
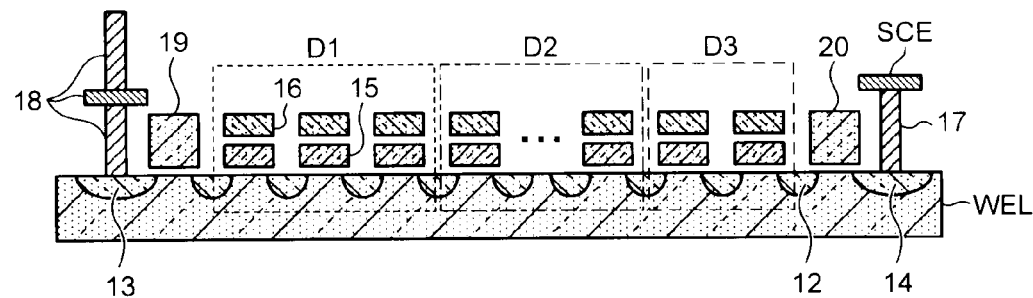
Figure 7C:
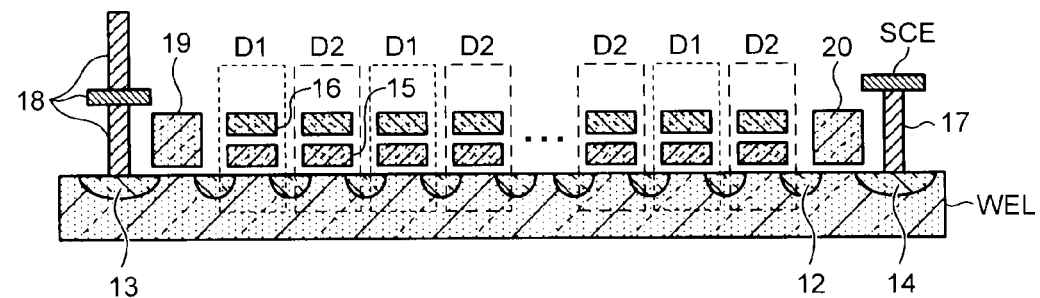
Figure 7D:
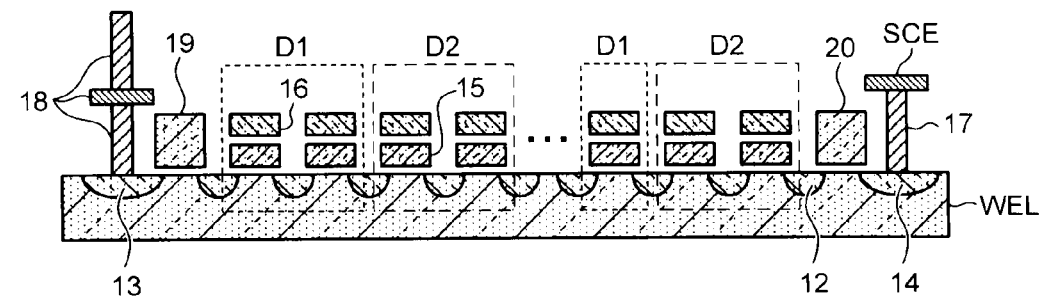

As illustrated in FIG. 7A, a block Bi may be divided into two by separating the block Bi at one location. As illustrated in FIG. 7B, the block Bi may also be divided into three by separating the block Bi at two locations. Alternatively, in the same group, the block Bi may be divided into p divisional blocks so that each two adjacent ones of the word lines WL1 through WLl belong to the same group. Also, as illustrated in FIG. 7C, the block Bi may be divided into two so that each two adjacent ones of the word lines WL1 through WLl do not belong to the same group. For example, the block Bi may be divided into two so that every other word line among the word lines WL1 through WLl belong to the same group. Alternatively, the block Bi may be divided into p so that each two adjacent ones of the word lines WL1 through WLl do not belong to the same group. Also, the block Bi may be divided into p so that word lines not adjacent to each other among the word lines WL1 through WLl belong to the same group. As illustrated in FIG. 7D, the block Bi may be divided into p so that word lines not adjacent to each other among the word lines WL1 through WLl, and word lines adjacent to each other among the word lines WL1 through WLl belong to the same group. For example, the block Bi may be divided into two so that every third word line among the word lines WL1 through WLl belong to the same group.

Here, the block Bi is divided so that each two adjacent ones of the word lines WL1 through WLl belong to different groups. Accordingly, a potential difference can be generated between the word lines WL1 through WLl in an erasing operation. Thus, electron traps between the word lines WL1 through WLl can be eliminated.

Second Embodiment

Figure 8:
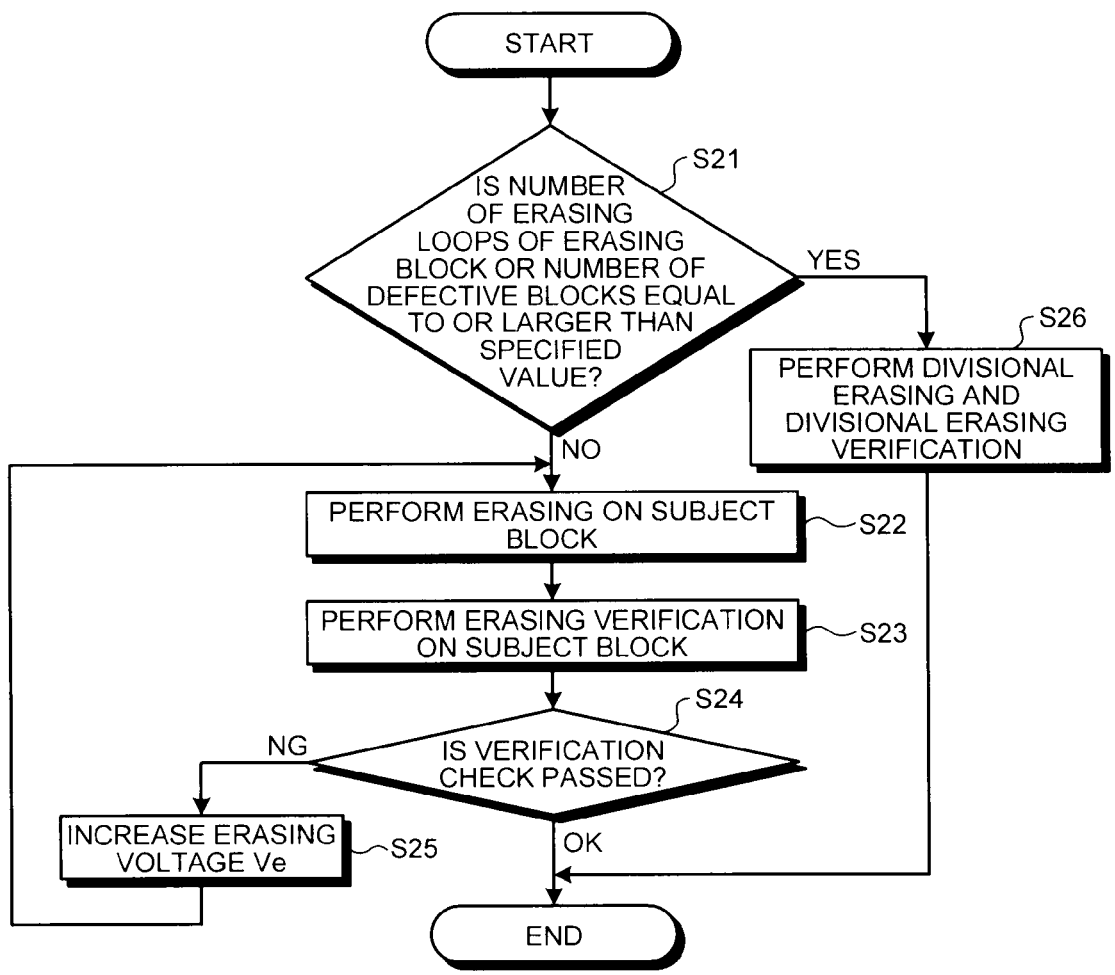
FIG. 8 is a flowchart illustrating erasing operations and erasing verifying operations in a nonvolatile semiconductor memory device according to a second embodiment.

FIG. 8 is a flowchart illustrating erasing operations and erasing verifying operations in a nonvolatile semiconductor memory device according to a second embodiment.

In FIG. 8, if the number of erasing loops of an erased block or the number of defective blocks is smaller than a specified value (S21), an erasing operation and an erasing verifying operation are performed on a block Bi (S22, S23). If the verification check is not passed (S24), the erasing voltage Ve is increased (S25). The procedures of S22 through S25 are repeated for the block Bi until the verification check is passed (S24).

If the number of erasing loops of an erased block or the number of defective blocks is equal to or larger than a specified value (S21), on the other hand, an erasing operation and an erasing verifying operation are performed on each of the divisional blocks D1 through Dp formed by dividing the block Bi (S26). It should be noted that the procedure of S26 is the same as the operations of FIG. 6. Here, the number of erasing loops of an erased block is the cumulative number of erasing operations performed on the block Bi subjected to erasing. The number of defective blocks is the number of blocks determined to be defective in the initial stage or through usage among the blocks included in the nonvolatile semiconductor memory device.

Before degradation of memory cells progresses, collective erasing can be performed by the block, and the time required for erasing can be shortened.

Third Embodiment

Figure 9:
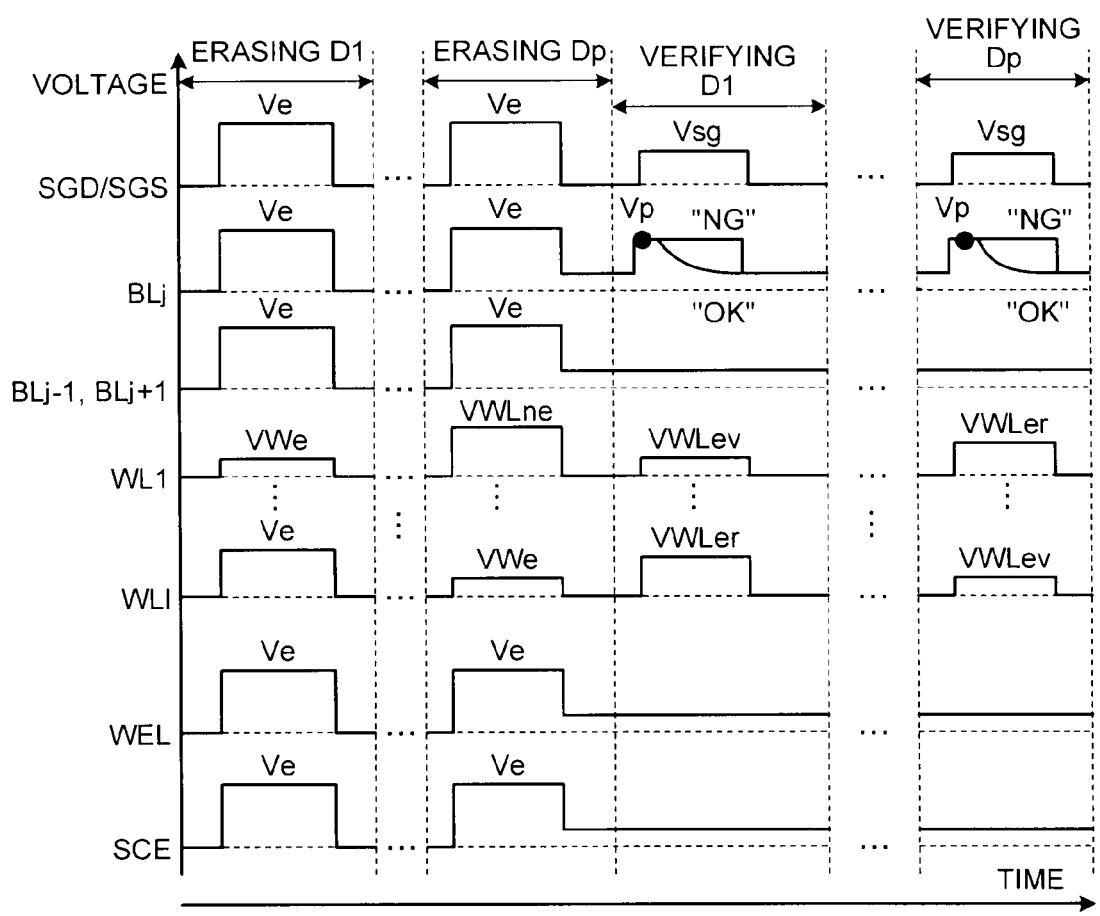
FIG. 9 is a timing chart illustrating the first erasing operations and erasing verifying operations performed on p divisional blocks in a nonvolatile semiconductor memory device according to a third embodiment.

FIG. 9 is a timing chart illustrating the first erasing operations and erasing verifying operations performed on p divisional blocks in a nonvolatile semiconductor memory device according to a third embodiment.

By the method illustrated in FIG. 5, the potentials of the bit lines BLj−1, BLj, and BLj+1 are set to 0 V, when a transition is made from an erasing operation to an erasing verifying operation, and when an erasing verifying operation transition is made between the divisional blocks D1 through Dp. By the method illustrated in FIG. 9, on the other hand, the potentials of the bit lines BLj−1, BLj, and BLj+1 are made floating.

By making the potentials of the bit lines BLj−1, BLj, and BLj+1 floating, the potentials of the bit lines BLj−1, BLj, and BLj+1 can be increased from 0 V when a transition is made from an erasing operation to an erasing verifying operation, and when an erasing verifying operation transition is made between the divisional blocks D1 through Dp. Accordingly, when a transition is made from an erasing operation to an erasing verifying operation, and when an erasing verifying operation transition is made between the divisional blocks D1 through Dp, the time for causing the bit lines BLj−1, BLj, and BLj+1 to discharge or recharge can be shortened, and divisional verifying operations can be made faster.

By the method illustrated in FIG. 5, the voltages of the source line SCE and the well WEL are set to 0 V when an erasing verifying operation is performed. By the method illustrated in FIG. 9, on the other hand, the voltages of the source line SCE and the well WEL are made higher than the determination voltage VWLev. In this manner, pseudo-reading can be performed on the negative threshold value side, and a margin can be secured for negative threshold values.

Fourth Embodiment

Figure 10:
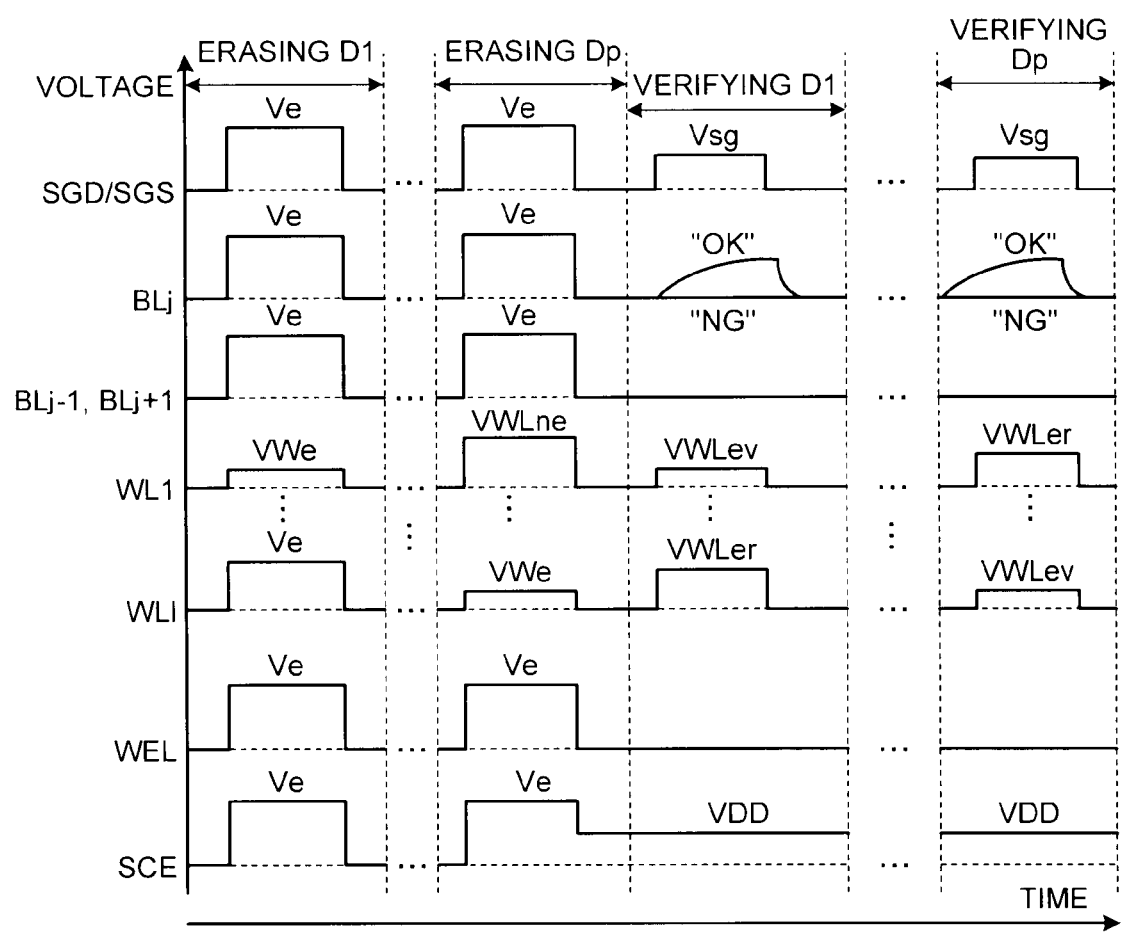
FIG. 10 is a timing chart illustrating the first erasing operations and erasing verifying operations performed on p divisional blocks in a nonvolatile semiconductor memory device according to a fourth embodiment.

FIG. 10 is a timing chart illustrating the first erasing operations and erasing verifying operations performed on p divisional blocks in a nonvolatile semiconductor memory device according to a fourth embodiment.

By the method illustrated in FIG. 5, in an erasing verifying operation, the precharge voltage Vp is applied to the bit line BLj, and a check is made to determine whether the charges in the bit line BLj are discharged via the NAND cell unit NUj. In this manner, a check is made to determine whether each of the divisional blocks D1 through Dp is in an erased state. By the method illustrated in FIG. 10, on the other hand, in an erasing verifying operation, a source voltage VDD is applied to the source line SCE, and a check is made to determine whether the bit line BLj is charged via the NAND cell unit NUj. In this manner, a check is made to determine whether each of the divisional blocks D1 through Dp is in an erased state.

In this manner, pseudo-reading can be performed on the negative threshold value side by using a back bias effect obtained through the charging of the bit line BLj.

Figure 11:
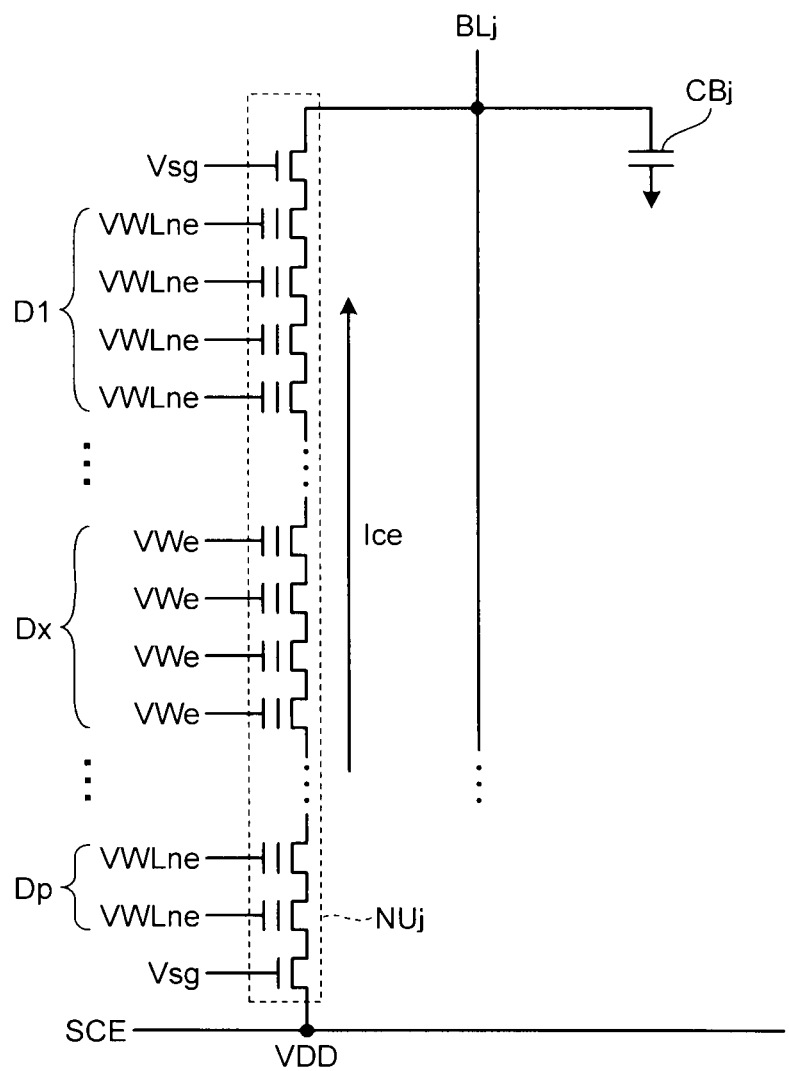
FIG. 11 is a circuit diagram of a cell unit, illustrating erasing verifying operations in the nonvolatile semiconductor memory device of FIG. 10.

FIG. 11 is a circuit diagram of a cell unit, illustrating erasing verifying operations in the nonvolatile semiconductor memory device of FIG. 10.

In FIG. 11, after erasing operations are performed on the cell transistors MTk−1 through MTk+2 in the divisional block Dx, the threshold voltage of the cell transistors MTk−1 through MTk+2 become equal to or lower than the determination voltage VWLev. A cell current Ice then flows when an erasing verifying operation is performed, and the parasitic capacitance CBj is charged. At this point, the potential of the bit line BLj depends on the threshold voltage of the cell transistor having the shallowest erasing performed thereon among the cell transistors MTk−1 through MTk+2. The potential of the bit line BLj at this point is compared with an erasing verifying voltage. If the potential of the bit line BLj is equal to or higher than the erasing verifying voltage, the erasing performed on the cell transistors MTk−1 through MTk+2 is determined to be complete. If the potential of the bit line BLj is lower than the erasing verifying voltage Vf, the erasing performed on the cell transistors MTk−1 through MTk+2 is determined to be incomplete.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a memory cell array having a block including m (m being an integer equal to or greater than 2) cell units sharing l (l being an integer equal to or greater than 2) word lines;
   a block dividing unit configured to divide the block into p (p being an integer equal to or greater than 2) by grouping the l word lines into p groups;
   an erasing unit configured to have an erasing operation performed on each of divisional blocks formed by the dividing performed by the block dividing unit; and
   an erasing verifying unit configured to have an erasing verifying operation performed on each of the divisional blocks in the block subjected to the erasing operation by the erasing unit, wherein the block comprises:
   two select gate lines,
   a plurality of first select transistors connected in common to one of the two select gate lines, and
   a plurality of second select transistors connected in common to the other of the two select gate lines.

2. The nonvolatile semiconductor memory device according to claim 1, wherein the erasing unit has the erasing operation performed on each of the divisional blocks, while applying a higher voltage than a voltage of a word line of a selected row to a word line of an unselected row.

3. The nonvolatile semiconductor memory device according to claim 2, wherein
   the erasing verifying unit applies a determination voltage to the word line of the selected row, and applies the higher voltage than the voltage of the word line of the selected row to the word line of the unselected row, the determination voltage being for determining whether an divisional block subjected to the erasing operation by the erasing unit is in an erased state,
   the erasing operation and the erasing verifying operation are performed on a block basis, and, when the block is not in an erased state after the erasing operation is repeated a specified number of times, the erasing operation and the erasing verifying operation are performed on the divisional block basis,
   the erasing verifying unit determines whether each of the divisional blocks is in an erased state by determining whether charges in a bit line are discharged via the corresponding one of the cell units,
   a voltage of the bit line is made floating when a transition is made from the erasing operation to the erasing verifying operation, and
   in the erasing operation, a voltage VWLne to be applied to the word line of the unselected row satisfies $Ve/2 \leq VWLne \leq Ve$, where Ve represents an erasing voltage to be applied to a well.

4. The nonvolatile semiconductor memory device according to claim 2, wherein the erasing verifying unit applies a determination voltage to the word line of the selected row, and applies the higher voltage than the voltage of the word line of the selected row to the word line of the unselected row, the determination voltage being for determining whether an divisional block subjected to the erasing operation by the erasing unit is in an erased state.

5. The nonvolatile semiconductor memory device according to claim 2, wherein the erasing operation and the erasing verifying operation are performed on a block basis, and, when the block is not in an erased state after the erasing operation is repeated a specified number of times, the erasing operation and the erasing verifying operation are performed on a divisional block basis.

6. The nonvolatile semiconductor memory device according to claim 2, wherein, in the erasing operation, a voltage VWLne to be applied to the word line of the unselected row satisfies $Ve/2 \leq VWLne \leq Ve$, where Ve represents an erasing voltage to be applied to a well.

7. The nonvolatile semiconductor memory device according to claim 2, wherein the erasing verifying unit determines whether each of the divisional blocks is in an erased state by determining whether charges in a bit line are discharged via the corresponding one of the cell units.

8. The nonvolatile semiconductor memory device according to claim 2, wherein the erasing verifying unit determines whether each of the divisional blocks is in an erased state by determining whether a bit line is charged via the corresponding one of the cell units when a voltage is applied to a source line.

9. The nonvolatile semiconductor memory device according to claim 2, wherein
   each of the cell units includes l cell transistors, and
   MT1 to MTl erasing verifying units apply a voltage to a source line and include two select transistors.

10. The nonvolatile semiconductor memory device according to claim 9, wherein, in each of the cell units, the l cell transistors are connected in series to form a NAND string, and the select transistors are connected to both ends of the NAND string.

11. The nonvolatile semiconductor memory device according to claim 10, wherein each of the cell transistors includes:
    a charge storage layer placed on a well formed in a semiconductor substrate; and
    a control gate electrode placed on the charge storage layer and connected to the corresponding one of the word lines.

12. The nonvolatile semiconductor memory device according to claim 11, wherein, when the erasing verifying operation is performed on a first divisional block, a sufficient voltage to turn on the cell transistors in a second divisional block not to be subjected to the erasing verifying operation is applied to the control gate electrode.

13. The nonvolatile semiconductor memory device according to claim 1, wherein, while erasing in each divisional block having passed a verification check in the erasing verifying operation is skipped, erasing is repeated in each divisional block not having passed the verification check in the erasing verifying operation until each divisional block passes the verification check in the erasing verifying operation.

14. The nonvolatile semiconductor memory device according to claim 13, wherein, when the verification check is not passed in the erasing verifying operation, erasing in the divisional blocks is repeated while the erasing voltage is stepped up.

15. The nonvolatile semiconductor memory device according to claim 1, wherein, in the same group, the block is divided into p to make word lines adjacent to each other to belong to the same group.

16. The nonvolatile semiconductor memory device according to claim 1, wherein the l word lines are grouped into p groups to make word lines not adjacent to each other to belong to the same group.

17. The nonvolatile semiconductor memory device according to claim 1, wherein the l word lines are grouped into p groups to make word lines adjacent to each other not to belong to the same group.

18. The nonvolatile semiconductor memory device according to claim 17, wherein the block is divided into two to make every other word line to belong to the same group.

19. The nonvolatile semiconductor memory device according to claim 1, wherein the l word lines are grouped into p groups to make word lines adjacent to each other and word lines not adjacent to each other to belong to the same group.

20. The nonvolatile semiconductor memory device according to claim 19, wherein the block is divided into two to make every third word line to belong to the same group.

* * * * *